(12) United States Patent
Chen

(10) Patent No.: US 9,647,094 B2
(45) Date of Patent: May 9, 2017

(54) METHOD OF MANUFACTURING A SEMICONDUCTOR HETEROEPITAXY STRUCTURE

(71) Applicant: The University of Kentucky Research Foundation, Lexington, KY (US)

(72) Inventor: Zhi David Chen, Lexington, KY (US)

(73) Assignee: UNIVERSITY OF KENTUCKY RESEARCH FOUNDATION, Lexington, KY (US)

( * ) Notice: Subject to any disclaimer, the term of this patent is extended or adjusted under 35 U.S.C. 154(b) by 0 days.

(21) Appl. No.: 13/957,480

(22) Filed: Aug. 2, 2013

(65) Prior Publication Data

US 2015/0037930 A1    Feb. 5, 2015

(51) Int. Cl.
*H01L 21/02* (2006.01)
*H01L 29/66* (2006.01)
*H01L 21/322* (2006.01)

(52) U.S. Cl.
CPC .... *H01L 29/66969* (2013.01); *H01L 21/3221* (2013.01)

(58) Field of Classification Search
CPC ..... H01L 21/823807; H01L 21/823462; H01L 21/823857; H01L 21/324; H01L 27/0922; H01L 29/78; H01L 29/7847; H01L 51/5237; H01L 21/3245; H01L 21/3242; H01L 21/3247; H01L 21/3221; H01L 21/3223; H01L 21/3225; H01L 21/3226; H01L 21/322828; H01L 29/772; H01L 29/66969

USPC ........ 438/104, 591, 299, 503; 257/288, 411, 257/E21.19, E21.09, E21.444, E29.242, 257/E29.255
See application file for complete search history.

(56) References Cited

U.S. PATENT DOCUMENTS

| | | |
|---|---|---|
| 7,052,940 B2 | 5/2006 | Lee |
| 7,226,831 B1 | 6/2007 | Metz et al. |
| 7,989,321 B2 | 8/2011 | Chen et al. |
| 7,989,902 B2 | 8/2011 | Ando et al. |
| 8,063,413 B2 | 11/2011 | Bai et al. |
| 8,101,999 B2 | 1/2012 | Takizawa |
| 8,114,739 B2 | 2/2012 | Chowdhury et al. |
| 8,304,836 B2 | 11/2012 | Jagannathan et al. |
| 2004/0126988 A1* | 7/2004 | Hong ............ H01L 21/28202 438/431 |

(Continued)

FOREIGN PATENT DOCUMENTS

| | | |
|---|---|---|
| WO | 2007096996 A1 | 8/2007 |
| WO | 2011127720 A1 | 10/2011 |

OTHER PUBLICATIONS

Chew et al., TEM study on the evolution of Ge nanocrystals in Si oxide matrix as a function of Ge concentration and the Si reduction process, 2006, Advanced Materials for Micro- and Nano-Systems, Jan. 2006, pp. 1-4.*

(Continued)

*Primary Examiner* — Natalia Gondarenko
(74) *Attorney, Agent, or Firm* — King & Schickli, PLLC

(57) ABSTRACT

A method of manufacturing a semiconductor structure includes the steps of depositing a layer of semiconductor oxide on a base semiconductor layer, scavenging oxygen from the layer of semiconductor oxide and recrystallizing the oxygen scavenged layer of semiconductor oxide as a semiconductor heteroepitaxy layer.

13 Claims, 2 Drawing Sheets

(56) References Cited

U.S. PATENT DOCUMENTS

| | | | |
|---|---|---|---|
| 2005/0082624 A1* | 4/2005 | Gousev et al. | 257/410 |
| 2006/0214241 A1* | 9/2006 | Pidin | 257/407 |
| 2007/0164306 A1* | 7/2007 | Nakahata | H01L 33/007 257/103 |
| 2008/0042173 A1* | 2/2008 | Nam | H01L 21/28088 257/288 |
| 2009/0146186 A1* | 6/2009 | Kub | H01L 29/1602 257/194 |
| 2010/0044781 A1* | 2/2010 | Tanabe | 257/327 |
| 2010/0044806 A1 | 2/2010 | Hou et al. | |
| 2010/0244206 A1 | 9/2010 | Bu et al. | |
| 2010/0320547 A1 | 12/2010 | Ando et al. | |
| 2011/0147710 A1* | 6/2011 | Dewey | H01L 29/513 257/24 |
| 2011/0207280 A1 | 8/2011 | Ando et al. | |
| 2012/0021596 A1 | 1/2012 | Han et al. | |
| 2012/0092807 A1 | 4/2012 | Popovici et al. | |
| 2012/0098047 A1 | 4/2012 | Brewer et al. | |
| 2012/0168853 A1* | 7/2012 | Ji | C23C 16/45529 257/324 |
| 2012/0241738 A1 | 9/2012 | Imoto et al. | |
| 2012/0280288 A1* | 11/2012 | Ando et al. | 257/288 |
| 2012/0326245 A1 | 12/2012 | Ando et al. | |
| 2013/0075833 A1* | 3/2013 | Liu | H01L 21/28079 257/411 |
| 2013/0078779 A1* | 3/2013 | Xu | 438/299 |

OTHER PUBLICATIONS

Goncharova et al., Metal-gate-induced reduction of the interfacial layer in Hf oxide gate stacks, 2007, J. Vac. Sci. Technol. A 25(2), pp. 261-268.*

Chen, et al.; "Metal-insulator-semiconductor structures on p-type GaAs with low interface state density"; American Institute of Physics; Appl. Phys. Lett. 69 (2), Jul. 8, 1996; pp. 230-232.

Kim, et al.; "Engineering chemically abrupt high-k metal oxide/silicon interfaces using an oxygen-gettering metal overlayer"; Journal of Applied Physics; (Sep. 15, 2004) vol. 96, No. 6, pp. 3467-3472.

T. Ando, et al.; "Understanding Mobility Mechanisms in Extremely Scaled HfO2 (EOT 0.42 nm) Using Remote Interfacial Layer Scavenging Tachnique and Vt-tuning Dipoles with Gate-First Process"; IBM T.J. Watson Research Center, CLOBALFOUNDARIES, Yorktown Heights, NY; Aug. 5, 2010; pp. 17.1.1-17.1.4.

* cited by examiner

METHOD OF MANUFACTURING A SEMICONDUCTOR HETEROEPITAXY STRUCTURE

TECHNICAL FIELD

This document relates generally to the field of semiconductor structures and devices and, more particularly, to a new method of manufacturing a semiconductor heteroepitaxy structure.

BACKGROUND

Modern integrated circuits (ICs) have a profound impact on society because of the high growth in consumer electronics (i.e. cell phones and laptops). The key device in ICs, which functions as switches in logic gates, is the silicon-based metal-oxide-semiconductor field-effect transistor (MOSFET). For the past four decades, continuous scaling of MOSFETs and interconnects has dramatically improved the performance of microprocessors and memory chips used in many consumer electronic products. However, it is increasingly difficult to scale Si MOSFETs because Hf-based gate oxide is approaching its limit due to power constraint and mobility degradation. Si CMOS has entered an era of "power-constrained scaling". Without scaling gate oxide, high-mobility channel materials (III-V compound semiconductors) are needed for MOSFETs to enable increased performance and reduced power consumption.

In recent years, significant progress on III-V gate stacks has been made but huge challenges still remain. The interface trap density ($D_{it}$) between high-k oxides and $In_xGa_{1-x}As$ still remains too high ($10^{11}$-$10^{13}$ cm$^{-2}$), especially near valence band. On one hand, this results in lower mobility (<2000 cm$^2$/v-sec) for $In_xGa_{1-x}As$ inversion-mode n-MOSFETs. On the other hand, it is difficult to realize $In_xGa_{1-x}As$ p-MOSFETs. It is of critical importance to find a new approach for passivation of InGaAs to achieve low interface trap density (<1×10$^{11}$ cm$^{-2}$) so that both n-MOSFETs and p-MOSFETs can be realized using the same material system.

In the past GaAs has been passivated using Si interfacial layers grown by PECVD. Excellent high-frequency and quasi-static C-V curves were obtained on $Si_3N_4$/Si/p-GaAs with $D_{it}$ in the mid 10$^{10}$ cm$^{-2}$. It is the strained Si interlayer and the "clean" in-situ process that resulted in superior interfacial properties. The principle for superior $Si_3N_4$/Si/GaAs interface is that in the strained Si/GaAs interface the strained Si lattice is closely matched with GaAs. However, the in-situ process is a severe constraint for device processing.

This document relates to an ex-situ process technology for semiconductor heteroepitaxy using oxide deposition, oxygen scavenging, and crystallization

SUMMARY

A method of manufacturing a semiconductor heteroepitaxy structure may be broadly described as comprising the steps of depositing a layer of semiconductor oxide on a base semiconductor layer, scavenging oxygen from the semiconductor oxide layer and recrystallizing the oxygen scavenged semiconductor oxide layer as a semiconductor heteroepitaxy layer. Atomic layer deposition or chemical vapor deposition may be utilized to deposit the layer of semiconductor oxide on the base semiconductor layer. A material selected from a group consisting of InGaAs, GaAs, InAs, InSb, InGaSb, InAsSb, GaN, InGaN, GaP, InGaP, SiC, Si, Ge, SiGe, and mixtures thereof may be utilized for the base semiconductor layer. A material selected from a group consisting of silicon oxide, germanium oxide and mixtures thereof may be used for the layer of semiconductor oxide.

In accordance with an additional aspect, a method of manufacturing a semiconductor heteroepitaxy structure may be described as comprising the steps of (a) depositing a layer of semiconductor oxide on a base semiconductor layer wherein a first semiconductor of the base semiconductor layer differs from a second semiconductor of the semiconductor oxide layer; (b) depositing a layer of oxygen-permeable insulator on the layer of semiconductor oxide; (c) depositing a layer of oxygen-gettering metal onto the insulator layer; (d) depositing a layer of gate metal or a protecting dielectric material on the layer of oxygen-gettering metal; and (e) annealing at a predetermined temperature so that (1) oxygen atoms from the semiconductor oxide layer are scavenged, moved to and reacted with the layer of oxygen-gettering metal and (2) semiconductor atoms in the scavenged semiconductor oxide layer rearrange locations and recrystallize to form as a semiconductor epitaxy film on the base semiconductor layer. In one possible embodiment silicon oxide may be used for the layer of semiconductor oxide. In another possible embodiment germanium oxide may be used for the layer of semiconductor oxide.

In one possible embodiment hafnium oxide is used for the insulator layer. In one possible embodiment hafnium, titanium and mixtures thereof is used for the oxygen-gettering layer. In one possible embodiment the gate metal is made from titanium nitride (TiN), polysilicon or mixtures thereof. In another possible embodiment the protective dielectric material is made from TiN, $SiO_2$, $Si_3N_4$, $Al_2O_3$ and mixtures thereof.

In one possible embodiment the annealing step is completed at a predetermined temperature of between 300 to 1000° C. for a time period of between 1 to 600 seconds. In one possible embodiment the layer of semiconductor oxide has a thickness of between 0.5 nm and 10 nm. In one possible embodiment the base semiconductor layer has a thickness of between 100 μm and 600 μm. In one possible embodiment the insulator layer has a thickness of between 1 nm and 10 nm. In one possible embodiment the oxygen-gettering layer has a thickness of between 1 nm and 100 nm. In one possible embodiment the gate metal layer has a thickness of between 80 nm and 200 nm. In one possible embodiment the semiconductor epitaxy film has a thickness of between 0.2 nm and 5 nm. In one possible embodiment the gate metal layer has a thickness of between 80 nm and 200 nm.

In one possible embodiment the material for the base semiconductor layer is selected from a group consisting of InGaAs, GaAs, InAs, InSb, InGaSb, InAsSb, GaN, InGaN, GaP, InGaP, SiC, Si, Ge, SiGe, and mixtures thereof.

BRIEF DESCRIPTION OF THE DRAWINGS

The accompanying drawings incorporated herein and forming a part of the specification, illustrate several aspects of the current method of manufacturing a semiconductor heteroepitaxy structure and together with the description serve to explain certain principles thereof. In the drawings.

Reference will now be made in detail to the present preferred embodiments of the method as illustrated in the accompanying drawings.

DETAILED DESCRIPTION

Figure 1:
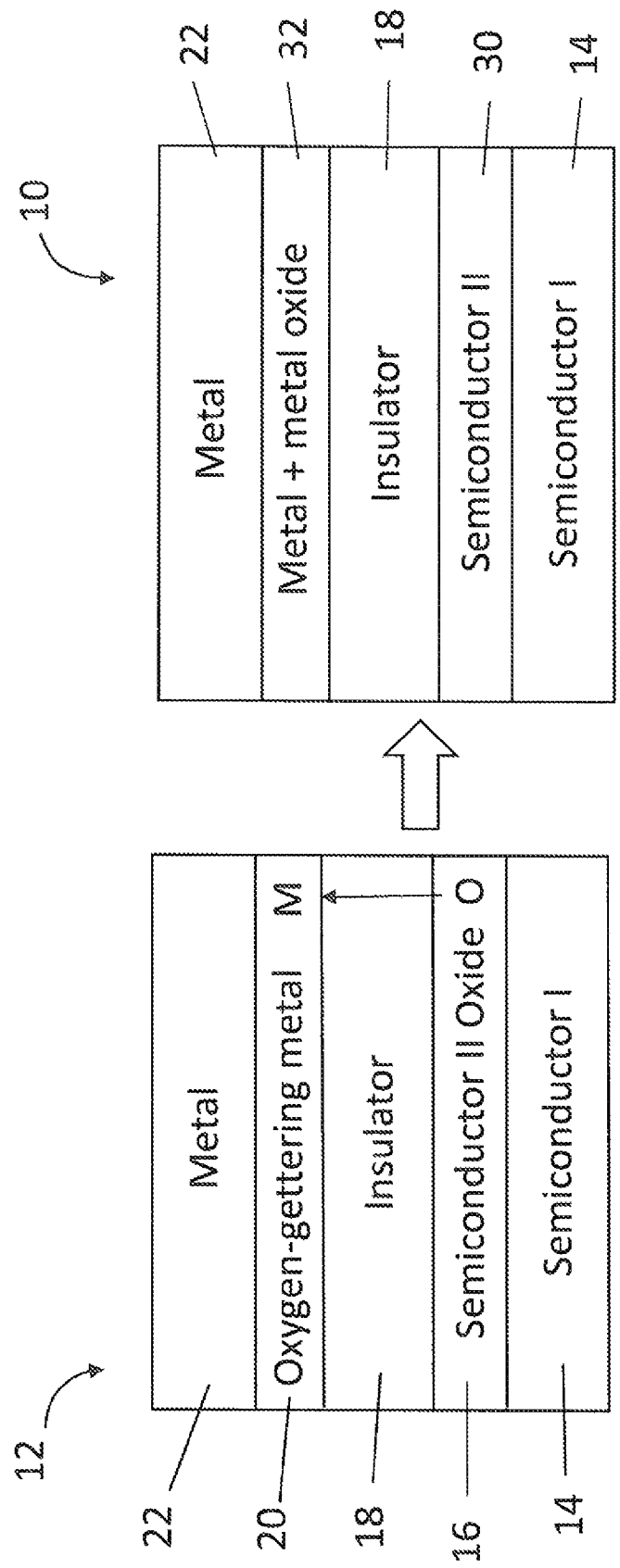
FIG. 1 is a schematical illustration of a semiconductor heteroepitaxy structure using oxide deposition, oxygen scavenging and crystallization during high temperature annealing. After the process, the semiconductor oxide layer is converted to a semiconductor epitaxy layer or film.

Reference is now made to FIG. 1 illustrating the method of manufacturing a semiconductor heteroepitaxy structure 10. As illustrated, structure precursor 12 includes a base semiconductor layer 14. Base semiconductor layer 14 may be made from substantially any known semiconductor material. In one useful embodiment the base semiconductor layer is formed from InGaAs. In another useful embodiment the base semiconductor layer is made from GaAs. In another useful embodiment the base semiconductor layer is made from InAs. In still another useful embodiment the base semiconductor layer is made from InSb. In still other useful embodiments the base semiconductor layer is made from InGaSb, InAsSb, GaN, InGaN, GaP, InGaP, SiC, Si, Ge, and SiGe. The base semiconductor layer 14 may even be made from a mixture of two or more of all of these materials if desired.

A layer of semiconductor oxide 16 is deposited on the base semiconductor layer 14. The semiconductor of the base semiconductor layer 14 differs from the semiconductor of the semiconductor oxide layer 16. In one useful embodiment the semiconductor oxide layer is made from silicone oxide. In another useful embodiment the semiconductor oxide layer 16 is made from germanium oxide. In still another useful embodiment the semiconductor oxide layer 16 is made from a mixture of silicone oxide and germanium oxide.

A layer of oxygen-permeable insulator 18 is deposited on the semiconductor oxide layer 16. In one particularly useful embodiment the insulator layer 18 is made from halfnium oxide. A layer of oxygen-gettering metal 20 is deposited on the insulator layer 18. In one useful embodiment the metal in the oxygen-gettering layer is halfnium. In another useful embodiment the metal in the oxygen-gettering layer is titanium. In yet another useful embodiment the metal in the oxygen-gettering layer 20 is a mixture of halfnium and titanium.

A layer of gate metal or protecting dielectric material 22 is deposited on the layer of oxygen-gettering metal 20. In one useful embodiment the gate metal layer 22 is made from titanium nitride (TiN). In another useful embodiment the gate metal layer 22 is made from polysilicon. In yet another useful embodiment the gate metal layer 22 is made from a mixture of titanium nitride and polysilicon. In still another useful embodiment the protecting dielectric material layer 22 is made from titanium nitride. In yet another useful embodiment the protecting dielectric material layer is made from $SiO_2$. In still another useful embodiment the protecting dielectric material layer 22 is made from $Si_3N_4$. In still another useful embodiment the layer of protecting dielectric material 22 is made from $Al_2O_3$. In still another useful embodiment the layer of protecting dielectric material 22 is made from a mixture of TiN, $SiO_2$, $Si_3N_4$ and $Al_2O_3$.

In one useful embodiment the semiconductor oxide layer 16 is deposited on the base semiconductor layer 14 using atomic layer deposition. In another useful embodiment the semiconductor oxide layer 16 is deposited on the base semiconductor layer 14 using chemical vapor deposition.

The layer of oxygen-permeable insulator 18 may be deposited on the semiconductor oxide layer 16 using atomic layer deposition, or chemical vapor deposition, or sputtering. The layer of oxygen-gettering metal 20 may be deposited on the insulator layer 18 using sputtering or evaporation. The layer of gate metal or protective dielectric material 22 may be deposited on the oxygen-gettering layer 20 using sputtering or evaporation.

Once the structure precursor 12 is fully constructed from all the layers 14, 16, 18, 20, 22, it is subjected to annealing at a predetermined temperature so that (1) oxygen atoms from the semiconductor oxide layer 16 are scavenged, moved to and reacted with the layer of oxygen-gettering metal 20 (note action arrow A in FIG. 1). As a result, the semiconductor atoms in the scavenged semiconductor oxide layer 16 rearrange locations and recrystallize to form as a semiconductor epitaxy film 30 between the base semiconductor layer 14 and the insulator layer 18 (note semiconductor heteroepitaxy structure 10 in FIG. 1 including semiconductor epitaxy film 30 and metal+metal oxide layer 32). In one possible embodiment the annealing is completed at the predetermined temperature of between 300-1000° C. for a time period of between 1-600 seconds. In another useful embodiment the annealing is completed at a predetermined temperature of between 500-1000° C. for a time period of between 1-600 seconds. In another useful embodiment the annealing is completed at a predetermined temperature of between 500-800° C. for a time period of between 1-600 seconds.

In one useful embodiment the layer of semiconductor oxide 16 has a thickness of between 0.5 nm and 10 nm. This layer is converted to a semiconductor epitaxy film 30 having a thickness of between 0.2 nm and 5 nm. In one useful embodiment the base semiconductor layer has a thickness of between 100 μm and 600 μm. In one useful embodiment the insulator layer has a thickness of between 1 nm and 10 nm. In one useful embodiment the oxygen-gettering layer 20 a thickness of between 1 nm and 100 nm. In one useful embodiment the gate metal layer 22 has a thickness of between 80 nm and 200 nm.

The following example is presented to further illustrate the present method of manufacturing a semiconductor heteroepitaxy structure 10 including a semiconductor epitaxy film 30.

EXAMPLE 1

Figure 2:
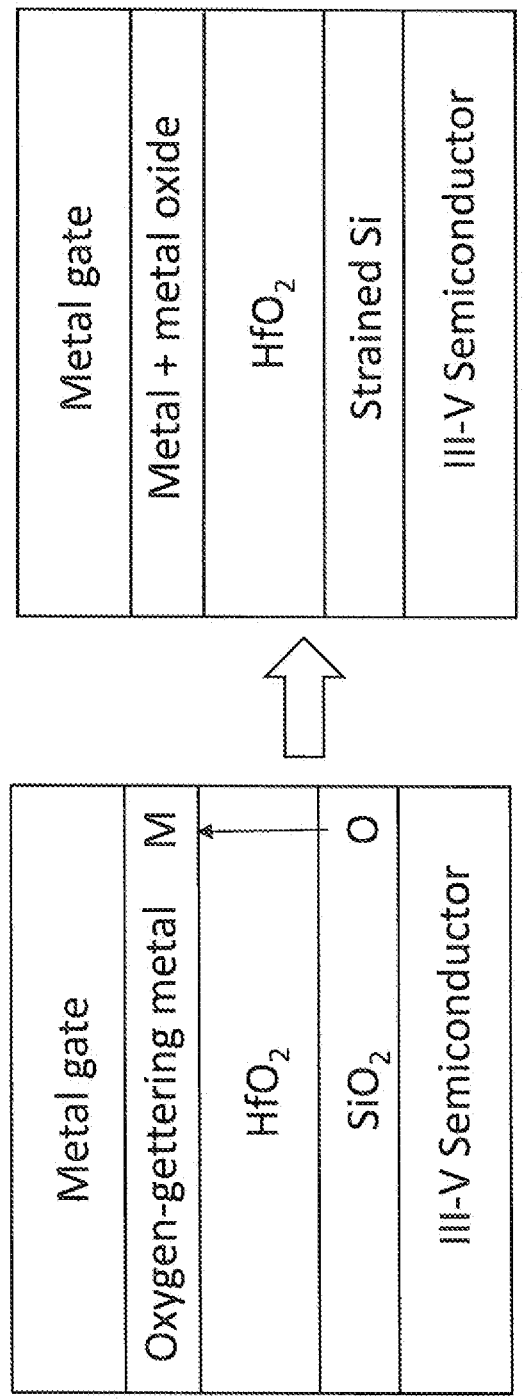
FIG. 2 is a schematical representation of the strained Si epitaxy on III-IV semiconductors for metal-oxide-semiconductor structures using oxide deposition, oxygen scavenging and crystallization during high temperature annealing. After the process, $SiO_2$ is converted to a strained Si layer.

FIG. 2 shows ex-situ strained-Si epitaxy on III-V semiconductors (GaAs, InGaAs etc.) using atomic layer deposition (ALD) to grow $SiO_2$, oxygen scavenging to convert $SiO_2$ to Si, and high-temperature annealing to crystallize Si to become strained Si. On a III-V semiconductor, ALD is used to grow a $SiO_2$ thin layer (0.5-5 nm). After cleaning, a III-V semiconductor substrate is loaded into the ALD chamber. The tris(dimethylamino)silane (TDMAS) precursor, water, and ozone are used for the $SiO_2$ film deposition at a substrate temperature of 50-300° C. A single ALD cycle for $SiO_2$ consisted of the following processes: the Si precursor (TDMAS) was introduced into the reactor chamber for 30 s, and then purged for 15 s. Following this, an oxidant $O_3$ was introduced for 15 s, and purged for 15 s. After thin $SiO_2$ films are successfully deposited on semiconductors, $HfO_2$ films are deposited on $SiO_2$ at 300° C. for 36 cycles by ALD system using TDMAH and $H_2O$ as sources. Once the III-V/$SiO_2$/$HfO_2$ structure is built, oxygen gettering metal, e.g. Ti or Hf, is deposited on the structure by either e-beam evaporation or sputtering, and then TiN/polysilicon gate metal is deposited on the oxygen gettering metal using sputtering and low-pressure chemical vapor deposition to form the III-V/SiO$_2$/HfO$_2$/Ti/TiN/polysilicon structure or the III-V/SiO$_2$/HfO$_2$/Hf/TiN/polysilicon structure. TiN/polysilicon is very important for protection of Ti from oxidation that is caused by oxygen diffusing from the outer ambient. The entire structure is then annealed at various temperatures of 400-1000° C. As long as the Si thickness is less than its critical thickness, strained Si can be obtained on III-V semiconductors. SiO$_2$ (<1.5 nm) can be deposited using ALD. The oxygen scavenging for removing the interfacial SiO$_2$ has been demonstrated on Si substrates, in which SiO$_2$ was actually converted to Si lattice on Si substrates [2,3]. It is well known that interface traps are originated from Ga and As native oxides. The advantage of the scavenging process is that it can remove Ga and As native oxides, so that more defects are removed at the interface, resulting in much better interfacial quality. As long as proper high temperature can be maintained, crystallization is highly possible. This disclosed technology may find broad applications in semiconductor industries.

In summary, numerous benefits result from employing the concepts disclosed in this document. The process or method is an ex-situ process because the base semiconductor layer 14 does not have to be kept in high vacuum. Some oxides on the surface of the base semiconductor layer 14 are fine, because all oxygen atoms will be scavenged later. Usually the semiconductor epitaxy layer or film 30 is very thin (less than 3 nm). Thus, it is easily oxidized when exposed to air. Using the present method or process, the epitaxy layer 30 is protected from contamination by the gate metal or protecting dielectric material layer 22. Accordingly, the manufacturing process is greatly simplified and may be completed in a more efficient and cost effective manner.

The foregoing has been presented for purposes of illustration and description. It is not intended to be exhaustive or to limit the embodiments to the precise form disclosed. Obvious modifications and variations are possible in light of the above teachings. All such modifications and variations are within the scope of the appended claims when interpreted in accordance with the breadth to which they are fairly, legally and equitably entitled.

What is claimed:

1. A method of manufacturing a semiconductor heteroepitaxy structure, comprising forming a structure precursor by:
    (a) depositing ex situ a layer of semiconductor silicon oxide on a base semiconductor substrate layer, wherein said base semiconductor substrate layer comprises a III-V semiconductor with native oxides, wherein thickness of the layer of silicon oxide is less than 1.5 nm;
    (b) depositing ex situ a layer of oxygen-permeable insulator on said layer of silicon oxide, wherein the layer of oxygen-permeable insulator comprises hafnium oxide;
    (c) depositing ex situ a layer of oxygen-gettering metal onto said insulator layer, wherein said layer of oxygen-gettering material is hafnium, titanium or mixtures thereof;
    (d) depositing ex situ a layer of gate metal or a protecting dielectric material comprising a titanium nitride-polysilicon mixture on said layer of oxygen-gettering metal, said layer of gate metal or said protecting dielectric material deposited to protect said oxygen-gettering metal from oxidation caused by oxygen diffusing from ambient air, thereby forming the structure precursor; and annealing the structure precursor at a predetermined temperature so that (1) oxygen atoms from said silicon oxide layer are scavenged, moved to and reacted with said layer of oxygen-gettering metal and (2) silicon atoms in the scavenged layer are rearranged and crystallized to form a strained, silicon epitaxy film on said base semiconductor substrate layer, thereby removing the native oxides and providing the semiconductor heteroepitaxy structure.

2. The method of claim 1, including using atomic layer deposition to deposit said layer of silicon oxide.

3. The method of claim 1, including using chemical vapor deposition to deposit said layer of silicon oxide.

4. The method of claim 1, including using a material selected from a group consisting of InGaAs, GaAs, InAs, InSb, InGaSb, InAsSb, GaN, InGaN, GaP, InGaP, and mixtures thereof for said base semiconductor substrate layer.

5. The method of claim 1, including completing said annealing at said predetermined temperature of between 300 to 1000° C. for a time of between 1 to 600 seconds.

6. The method of claim 1, wherein said layer of silicon oxide has a thickness of between 0.5 nm and 10 nm.

7. The method of claim 6, wherein said base semiconductor substrate layer has a thickness of between 100 μm and 600 μm.

8. The method of claim 7, wherein said insulator layer has a thickness of between 1 nm and 10 nm.

9. The method of claim 8, wherein said oxygen-gettering layer has a thickness of between 1 nm and 100 nm.

10. The method of claim 9, wherein said gate metal layer has a thickness of between 80 nm and 200 nm.

11. The method of claim 10, wherein said strained, silicon epitaxy film has a thickness of between 0.2 nm and 5 nm.

12. The method of claim 1, wherein said gate metal layer has a thickness of between 80 nm and 200 nm.

13. The method of claim 1, wherein said layer of oxygen-gettering metal and said gate metal layer are selected from different metals.

* * * * *